(12) United States Patent
Cook et al.

(10) Patent No.: US 11,948,871 B2
(45) Date of Patent: Apr. 2, 2024

(54) PROCESS FOR THIN FILM CAPACITOR INTEGRATION (71) Applicant: TEXAS INSTRUMENTS INCORPORATED, Dallas, TX (US)

(72) Inventors: Benjamin Stassen Cook, Los Gatos, CA (US); Yogesh Kumar Ramadass, San Jose, CA (US); Salvatore Frank Pavone, Murphy, TX (US); Mahmud Halim Chowdhury, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/325,197

(22) Filed: May 19, 2021

(65) Prior Publication Data

US 2022/0375836 A1 Nov. 24, 2022

(51) Int. Cl.
*H01L 23/495* (2006.01)
*H01L 23/00* (2006.01)

(52) U.S. Cl.
CPC .... *H01L 23/49589* (2013.01); *H01L 23/4951* (2013.01); *H01L 23/49524* (2013.01); *H01L 24/32* (2013.01); *H01L 24/73* (2013.01); *H01L 24/11* (2013.01); *H01L 24/13* (2013.01); *H01L 24/16* (2013.01); *H01L 24/92* (2013.01); *H01L 2224/11462* (2013.01); *H01L 2224/13147* (2013.01); *H01L 2224/13564* (2013.01);
(Continued)

(58) Field of Classification Search
CPC .......... H01L 23/49589; H01L 23/4951; H01L 23/49524; H01L 24/32; H01L 24/73; H01L 24/11; H01L 24/16; H01L 24/92; H01L 2224/11462; H01L 2224/13147; H01L 2224/13564; H01L 2224/1357; H01L 2224/16245; H01L 2224/32265; H01L 2224/73203; H01L 2224/73253; H01L 2224/9211
USPC .................................................. 257/673, 738
See application file for complete search history.

(56) References Cited

U.S. PATENT DOCUMENTS 6,222,246 B1 4/2001 Mak et al.
7,166,917 B2 1/2007 Yang et al.
(Continued)

OTHER PUBLICATIONS

PCT International Search Report;PCT/US 2022/011759; dated Apr. 14, 2022.

*Primary Examiner* — Jasmine J Clark
(74) *Attorney, Agent, or Firm* — Ray A. King; Frank D. Cimino (57) ABSTRACT

Disclosed embodiments include an integrated circuit (IC) comprising a silicon wafer, first and second conductive lines on the silicon wafer. There are first, second and third insulation blocks with portions on the first and second conductive lines and the silicon wafer, a metal pillar on the surface of the first conductive line opposite the silicon wafer, and a conductive adhesive block on the surface of the second conductive line opposite the silicon wafer. The IC also has a lead frame having first and second leads, and a capacitor having first and second capacitor terminals in which the first capacitor terminal is connected to the second lead using conductive adhesive, the second capacitor terminal is connected to the second conductive line through the conductive adhesive block, and the first lead is coupled to the first conductive line.

20 Claims, 5 Drawing Sheets

(52) U.S. Cl.
CPC ............... *H01L 2224/1357* (2013.01); *H01L 2224/16245* (2013.01); *H01L 2224/32265* (2013.01); *H01L 2224/73203* (2013.01); *H01L 2224/73253* (2013.01); *H01L 2224/9211* (2013.01); *H01L 2924/19015* (2013.01); *H01L 2924/19041* (2013.01); *H01L 2924/19103* (2013.01); *H01L 2924/19104* (2013.01)

(56) References Cited

U.S. PATENT DOCUMENTS

| | | |
|---|---|---|
| 7,553,752 B2 | 6/2009 | Kuan et al. |
| 7,807,503 B2 | 10/2010 | Doan |
| 8,310,061 B2 | 11/2012 | Chandrasekaran |
| 9,576,821 B2 | 2/2017 | Lo et al. |
| 2004/0183209 A1 | 9/2004 | Lin |
| 2009/0057867 A1 | 3/2009 | Hool |
| 2009/0296310 A1 | 12/2009 | Chikara |
| 2010/0032803 A1 | 2/2010 | Lippitt, III et al. |
| 2010/0117195 A1 | 5/2010 | Burke et al. |
| 2011/0001240 A1 | 1/2011 | Merilo et al. |
| 2013/0062764 A1* | 3/2013 | Jin .................. H01L 23/3114 257/737 |
| 2018/0090460 A1* | 3/2018 | Chu .................. H01L 23/3192 |
| 2019/0081133 A1 | 3/2019 | Cook et al. |
| 2023/0111006 A1* | 4/2023 | Tsai .................. H01L 21/486 257/774 |

* cited by examiner

PROCESS FOR THIN FILM CAPACITOR INTEGRATION

REFERENCE TO RELATED APPLICATION

This patent application does not claim the benefit of any other patent application.

BACKGROUND

This application relates to the integration of thin film capacitors into a flip chip package. Flip chip packaging derives its name from the assembly method of flipping the silicon wafer over or upside-down and placing the silicon wafer on the lead frame, thus electrically and mechanically connecting the silicon substrate with the lead frame. Unlike interconnection of substrate and lead frame through wire bonding, flip chip uses solder bumps to make the connection. This flip chip structure allows the input/output (I/O) pads to be distributed all over the surface of the chip, not only within the peripheral region of the packaged device between the silicon substrate and the edge of the package. This results in a smaller package footprint, which is desirable.

Another advantage derived from the use of flip chip is the absence of bonding wires, thus reducing inductance and the accompanying negative effects of inductance on signals. An integrated circuit (IC) assembly process that is generally linked with flip chip packaging is wafer bumping. Wafer bumping is a packaging technique where 'bumps' or 'balls' made of solder are formed on the whole wafers prior to the wafer being diced into individual dies.

In some examples, the bumps may be placed onto an under bump metallization (UBM) material that is plated onto the die pads. The bumped dies can be placed into packages or soldered directly to a printed circuit board. The bumps may be composed of many different materials. Lead free bumps (e.g. SnAg) are used in many applications, although copper pillar bumps offer the advantage of higher density.

Capacitors play an important role in ICs. Decoupling capacitors may be connected between a power terminal and ground to protect the IC from electrical noise. Reducing electrical noise may improve the performance of the IC, and prevent it from transmitting noise to other circuits. In the case of decoupling capacitors, it is desirable to place the capacitor as close to the device as possible. Capacitors may also be used in an IC in integrating amplifiers or as a component of a filter circuit.

Capacitors can be fabricated directly on the silicon wafer during wafer fabrication, but there may be drawbacks to this in some cases. For example, semiconductor capacitors require a considerable amount of silicon area, potentially increasing the cost of the device. For example, one semiconductor process yields metal capacitors of 2 femtofarads per square micrometer. Therefore, a 100 pF capacitor in this process would require an area of 50,000 square micrometers of silicon area. An alternative to fabricating capacitors during wafer fabrication is to purchase thin film capacitors from a capacitor vendor and integrate the purchased capacitor with the silicon die in a packaged device.

SUMMARY

The first disclosed embodiment presents an integrated circuit (IC) comprising a silicon wafer and first and second conductive lines on the silicon wafer. There are first, second and third insulation blocks with portions on the first and second conductive lines and the silicon wafer, a metal pillar on the surface of the first conductive line opposite the silicon wafer, and a conductive adhesive block on the surface of the second conductive line opposite the silicon wafer.

The IC can also have a lead frame having first and second leads, and a capacitor having first and second capacitor terminals in which the first capacitor terminal is connected to the second lead using conductive adhesive, the second capacitor terminal is connected to the second conductive line through the conductive adhesive block, and the first lead is coupled to the first conductive line.

Another example embodiment discloses a method of fabricating an integrated circuit (IC) in a flip chip package comprising forming first and second conductive lines on a silicon wafer, then applying first, second and third insulation blocks to the surface of the first conductive line opposite the silicon wafer and exposed portions of the silicon wafer. A metal pillar is formed on the surface of the first conductive line opposite the silicon wafer, the metal pillar filling a first gap. A second gap is filled with a conductive adhesive, creating a silicon subassembly. The method includes bonding a first capacitor terminal to a first lead frame lead using conductive adhesive, and connecting the silicon subassembly to the lead frame, mating a second lead frame lead to the metal pillar using conductive adhesive, and mating a second capacitor terminal to the second conductive line.

Example embodiments also include an IC comprising a silicon wafer and first and second conductive lines on the silicon wafer. There are first, second and third insulation blocks with portions on the first and second conductive lines and the silicon wafer. Also, there is a first metal pillar on the surface of the first conductive line opposite the silicon wafer filling a first gap, and a second metal pillar on the surface of the second conductive line opposite the silicon wafer filling a second gap.

Additionally, there is a capacitor having first and second capacitor terminals, the first capacitor terminal coupled to the surface of the silicon wafer opposite the first and second conductive lines, and a lead frame having first and second leads, the first and second leads connected to the first and second metal pillars, respectively, using conductive adhesive.

The same reference numbers are used in the drawings to depict the same or similar (by function and/or structure) features. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
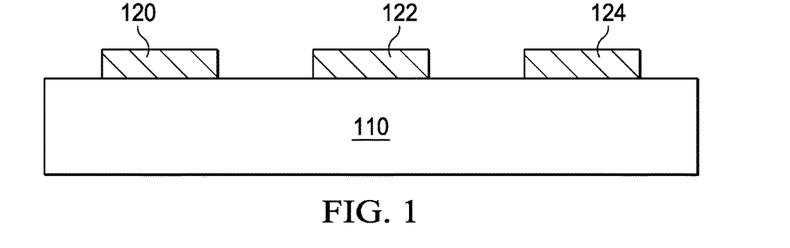
FIG. 1 shows a first step in an example embodiment for a bumped die having an integrated capacitor.

FIG. 1 shows a first step in an example embodiment for a bumped die having an integrated capacitor. The process begins with a silicon wafer 110. A silicon wafer 110 may contain thousands of dies that will be singulated at a later time. Conductive lines 120, 122 and 124 are formed on the silicon wafer 110, in some cases by depositing or applying conductive material on the silicon wafer. The conductive lines 120, 122 and 124 may in some instances be made of copper or some other metal, and can be used as a base to form metal pillars that will make connections between the silicon wafer 110 and the lead frame, thus allowing selected signals to be accessible to external circuitry. The conductive lines 120, 122 and 124 may be formed on the silicon wafer using a process such as copper over active (COA) deposition or another similar process.

Figure 2:
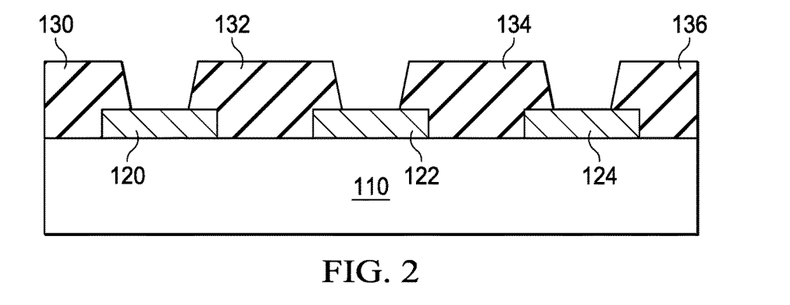
FIG. 2 shows the example embodiment of FIG. 1 with insulation blocks added.

In FIG. 2, insulation blocks 130, 132, 134 and 136, such as polyimide (PI), are applied to seal and protect the silicon wafer 110 from contaminants and foreign material. The insulation blocks 130, 132, 134 and 136 can be used as a passivation layer to allow an additional layer of circuitry beyond what is formed on the silicon wafer 110 during wafer fabrication. Patterning of the insulation blocks 130, 132, 134 and 136 can be done using a wet etch process, a dry etch process, or photolithography. Gaps are intentionally left between insulation blocks 130 and 132, between insulation blocks 132 and 134, and between insulation blocks 134 and 136.

Figure 3:
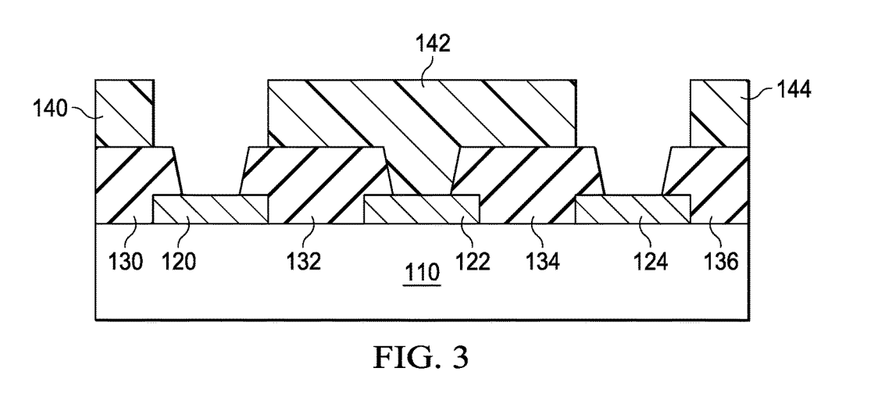
FIG. 3 shows the example embodiment of FIG. 2 with a pillar resist mask applied.

Metal pillars extending from conductive lines 120 and 124 are formed to serve as electrical leads that can connect circuits on the silicon wafer 110 to external circuitry. The metal pillar structures can be created using photolithographic techniques, and can be formed using polymer material as a mold to define the shape and dimensions of the metal pillars. The polymer material can also serve as a photoresist during the photolithographic process to prevent exposure outside of the areas where the metal pillars are to be formed. Referring to FIG. 3, pillar resist 140, 142 and 144 is a mask applied to insulation blocks 130, 132 and 134, and 136, respectively, in the areas where metal pillars will not be formed. Pillar resist 142 is applied on conductive line 122 because a metal pillar will not be formed on conductive line 122. However, metal pillars will be formed on conductive lines 120 and 124, so pillar resist is not applied to conductive lines 120 and 124.

Metal pillars will be used for connection to leads in the lead frame. Therefore, metal pillars are formed where there will be a lead on the lead frame to connect to when the metal pillars (i.e. bumps) are mated to lead frame leads during the assembly process. The pillar resist 140, 142 and 144 is preferably applied to a height that is the intended height of the metal pillars, or possibly a little higher, to ensure that the metal pillars maintain the proper shape as they are formed, and do not spread at the top.

Figure 4:
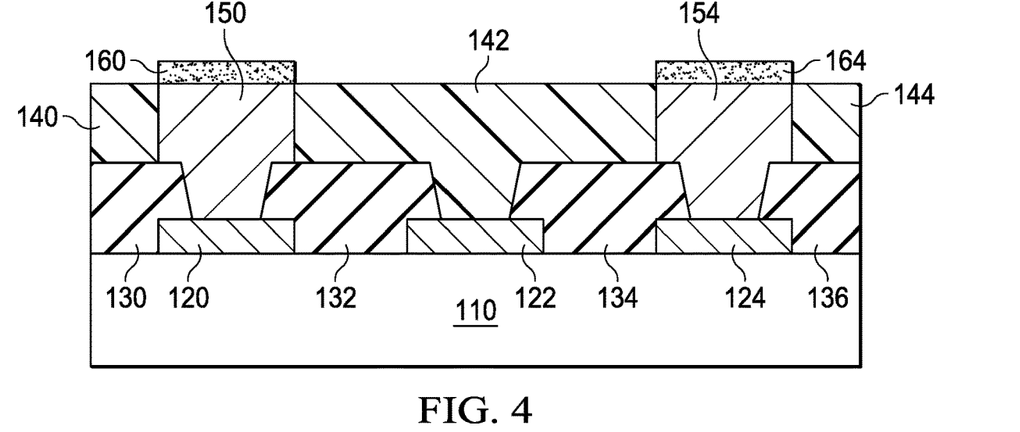
FIG. 4 shows the example embodiment of FIG. 3 after metal pillars have been grown.
Figure 5:
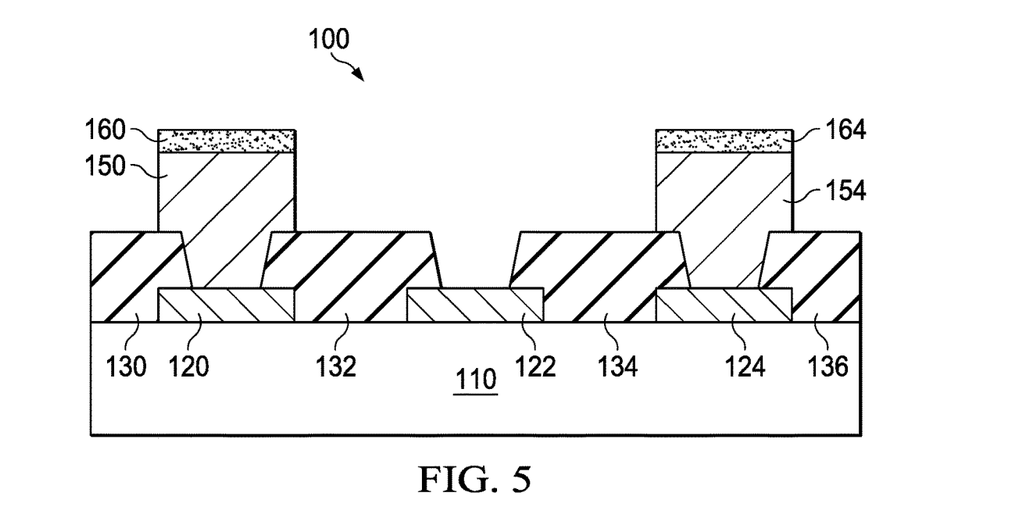
FIG. 5 shows a completed bump subassembly.

Referring to FIG. 4, metal pillars 150 and 154 are formed on conductive lines 120 and 124, respectively. A seed layer may be sputtered onto conductive lines 120 and 124 to initiate the process of forming metal pillars 150 and 154. The metal pillars 150 and 154 can be formed by electroplating or a similar process. A conductive adhesive layer 160 is applied to the exposed surface of metal pillar 150, and conductive adhesive layer 164 is applied to the exposed surface of metal pillar 154. The conductive adhesives 160 and 164 will be used to bond metal pillars 150 and 154, respectively, to leads of the lead frame during assembly. The pillar resist 140, 142 and 144 is removed after the formation of metal pillars 150 and 154 is completed. FIG. 5 shows the complete bump subassembly 100 that is ready to be inverted and attached to the lead frame during the assembly process.

Figure 6:
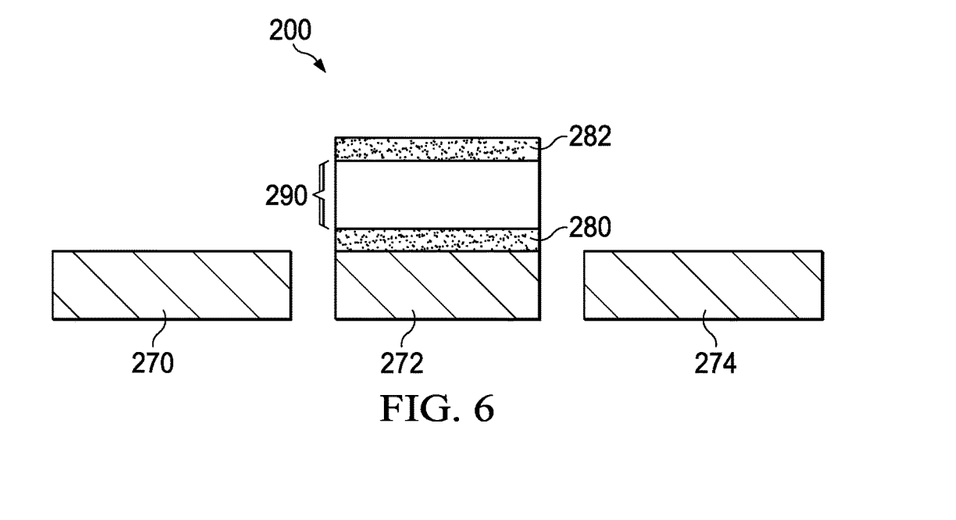
FIG. 6 shows a lead frame subassembly with an integrated capacitor.

Referring to FIG. 6, lead frame subassembly 200 has leads 270, 272 and 274. Lead 272 is used for the integration of capacitor 290, and will be connected to conductive line 122 when bump subassembly 100 is inverted and mated with lead frame subassembly 200. Capacitor 290 is bonded to lead 272 using conductive adhesive 280, which can be solder, conductive paste or conductive epoxy. Conductive adhesive 282, which may be of the same composition as conductive adhesive 280, is applied to the opposite surface of capacitor 290.

Figure 7:
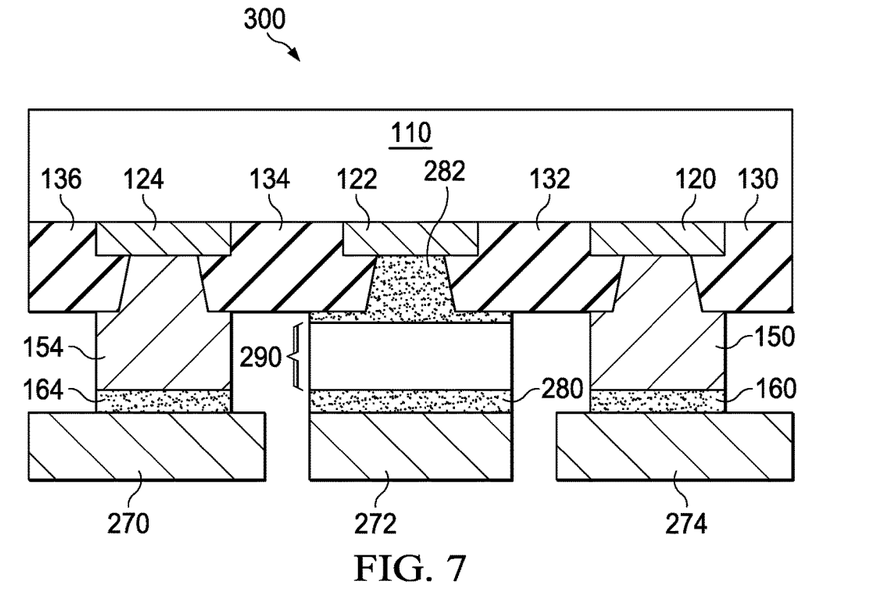
FIG. 7 shows a bump subassembly mated with a lead frame subassembly, forming a flip chip assembly.

Referring to FIG. 7, bump subassembly 100 is mated with lead frame subassembly 200 forming flip chip assembly 300. Conductive adhesive 282 flows into and fills the gap between capacitor 290 and conductive line 122, forming an electrical and mechanical connection between capacitor 290 and conductive line 122. Conductive adhesive 160 forms an electrical and mechanical connection between metal pillar 150 and lead 270, and adhesive 164 forms an electrical and mechanical connection between metal pillar 154 and lead 274. Thus, leads 270 and 274 are electrically and mechanically connected to silicon wafer 110, and capacitor 290 is coupled between lead 272 and silicon wafer 110.

Integrating the capacitor 290 into what would have otherwise been unused space within flip chip assembly 300 reduces overall package size and saves PCB space in comparison to placing the capacitor on the periphery of the package, outside the footprint of the die. Additionally, having the capacitor closer to the circuit on silicon wafer 110 improves circuit performance because the effectiveness of a decoupling capacitor is at least partially dependent upon its distance from the circuit.

Figure 8:
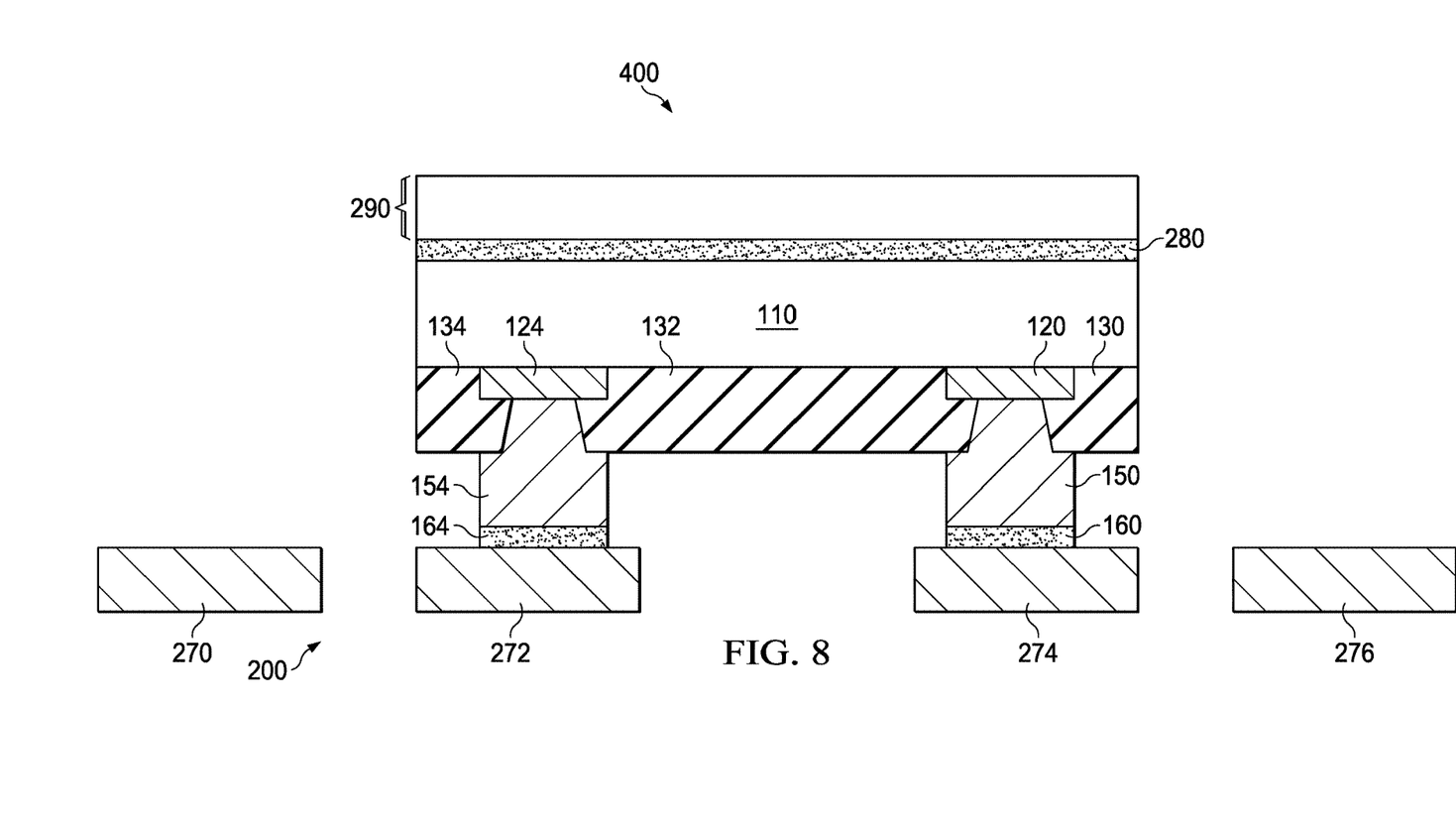
FIG. 8 shows a preliminary assembly of an example embodiment for the integration of a capacitor into a flip chip module.

FIG. 8 shows a preliminary assembly of an example embodiment 400 for integration of a capacitor into a flip chip module. Conductive lines 120 and 124 are formed on silicon wafer 110 using a process such as copper over active (COA) or a similar process. Insulation 130, 132 and 134 are applied to silicon wafer 110 on the same surface as conductive lines 120 and 124 to seal and protect silicon wafer 110 from contaminants and foreign material. Insulation 130, 132 and 134 are applied to the areas on the surface of silicon wafer 110 that are not covered by conductive lines 120 and 124. A pillar resist mask (not shown) is applied to insulation 130, 132 and 134 prior to the formation of metal pillars to mask the areas where metal pillars will not be formed. The pillar resist (not shown) defines the diameter and shape of metal pillars 150 and 154 by acting as a mold for the metal pillars. Metal pillars 150 and 154 are formed on conductive lines 120 and 124, respectively, to serve as electrical leads connecting circuits on silicon wafer 110 to leads on the lead frame.

The pillar resist (not shown) is removed after the formation of metal pillars 150 and 154 is complete. Conductive adhesive layer 160 is applied to the exposed surface of metal pillar 150, and conductive adhesive layer 164 is applied to the exposed surface of metal pillar 154.

Lead frame subassembly 200 has leads 270, 272, 274 and 276. Conductive adhesives 160 and 164 bond metal pillars 150 and 154, respectively, to leads 274 and 272, respectively, of the lead frame. Using conductive adhesive 280, capacitor 290 is bonded to the surface of silicon wafer 110 opposite the surface that is bonded to conductive lines 120 and 124. Conductive adhesive 280 provides an electrical connection between capacitor 290 and silicon wafer 110.

Figure 9:
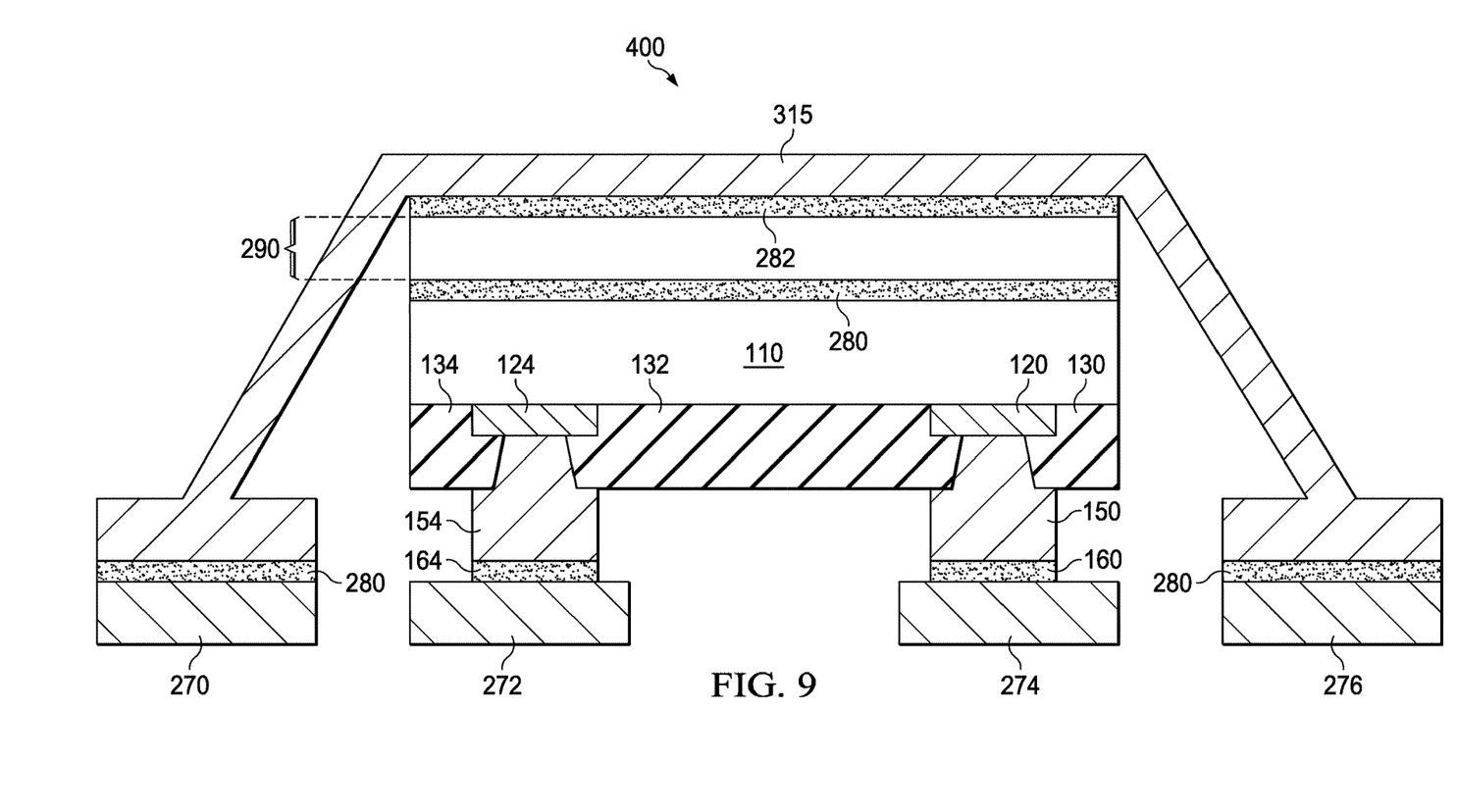
FIG. 9 shows a completed assembly of an example embodiment for the integration of a capacitor into a flip chip module.

FIG. 9 shows a completed assembly of example embodiment 400 for integration of a capacitor into a flip chip module. Metal clip 315 is bonded to capacitor 290 using conductive adhesive 282. Metal clip 315 is bonded to leads 270 and 276 using conductive adhesive 280. Metal clip 315 provides mechanical support to capacitor 290 holding it in contact with substrate 110. Metal clip 315 also provides an electrical connection between a first lead of capacitor 290 and leads 270 and 276. The second lead of capacitor 290 is in contact with, and making an electrical connection to, the surface of silicon wafer 110 opposite conductive lines 120 and 124.

Metal clip 315 is bonded to leads 270 and 276 using conductive adhesive 280. Conductive adhesive 280 provides both a mechanical and an electrical connection of clip 315 to leads 270 and 276. These connections provide an electrical connection between the first lead of capacitor 290 and leads 270 and 290 of the lead frame through metal clip 315 and conductive adhesive 270. The embodiment of FIG. 9 provides the advantage of having the capacitor in close proximity to the circuit on silicon wafer 110, thus improving circuit performance. The example embodiment of FIG. 9 also provides the advantage of reducing package size and saving PCB space compared to placing the capacitor on the periphery of the package.

Figure 10:
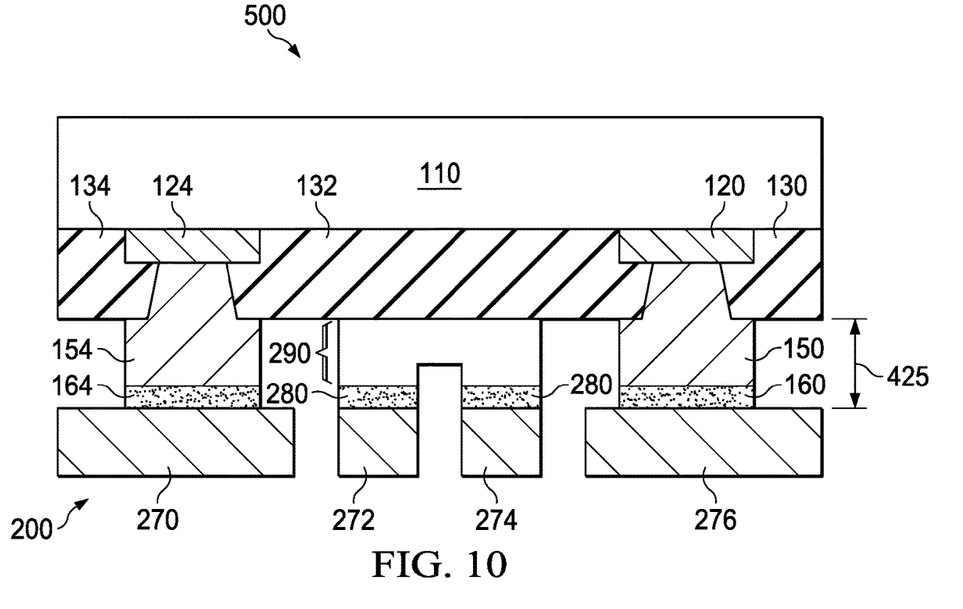
FIG. 10 shows an example embodiment for integration of a capacitor into a flip chip module.

FIG. 10 shows an example embodiment 500 for integration of a capacitor into a flip chip module. Conductive lines 120 and 124 are deposited on silicon wafer 110. The conductive lines 120 and 124 can be used as a base to form metal pillar bumps that will make electrical connections between the silicon wafer 110 and the lead frame, and allow selected signals to be brought out to external circuitry. Insulation 130, 132 and 134 is applied to seal and protect the silicon wafer 110 from contaminants and foreign material in the surface areas not occupied by conductive lines 120 and 124.

Metal pillars extending from conductive lines 120 and 124 are formed, serving as electrical leads connecting circuits on the silicon wafer 110 to leads on the lead frame. The metal pillar structures can be formed using a mold of polymer material to define the dimensions and shape of the metal pillars. The polymer material also serves as a photoresist during the photolithographic process to prevent exposure outside the areas where the metal pillars are to be formed. The polymer photoresist (not shown) is applied over conductive lines 120 and 124. Because the metal pillars are used for connection to leads in the lead frame, metal pillars are formed where there will be a lead on the lead frame to connect to when the conductive pillars (i.e. bumps) are later mated with the lead frame.

A seed layer may be sputtered onto conductive lines 120 and 124 to initiate the process of forming metal pillars 150 and 154. The metal pillars 150 and 154 are grown to a dimension 425 beyond the insulation 130, 132 and 134. A conductive adhesive layer 160 is applied to the exposed surface of metal pillar 150, and conductive adhesive layer 164 is applied to the exposed surface of metal pillar 154. The conductive adhesives 160 and 164 will be used to bond the metal pillars 150 and 154, respectively, to leads of the lead frame during assembly. The polymer photoresist (not shown) is removed after the formation of metal pillars 150 and 154 is complete.

Lead frame subassembly 200 has leads 270, 272, 274 and 276. Conductive adhesives 160 and 164 bond metal pillars 150 and 154, respectively, to leads 276 and 270, respectively, of the lead frame. Using conductive adhesive 280, first and second terminals of capacitor 290 are bonded to leads 272 and 274, forming an electrical connection between the first and second capacitor terminals and leads 272 and 274, respectively.

When the silicon wafer subassembly is mated with the lead frame subassembly 200, metal pillar 154 is connected to lead 270, metal pillar 150 is connected to lead 276, and capacitor 290 is mated to insulation 132. The dimension 425 is chosen to be at least the height of capacitor 290. This helps to ensure that capacitor 290 will fit into the space created by and between metal pillars 150 and 154. The example embodiment shown in FIG. 10 provides the advantage of reducing package size and saving PCB space compared to placing the capacitor on the periphery of the package.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device, or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While operations are depicted as occurring in a particular order, this should not be understood as requiring that all illustrated operations be performed, or that the operations are required to be performed in that order to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit (IC) comprising:
a silicon wafer;
a first conductive line having first and second surfaces, wherein the second surface is opposite the first surface, and the first surface of the first conductive line is coupled to the silicon wafer;
a second conductive line having first and second surfaces, wherein the second surface is opposite the first surface, and the first surface of the second conductive line is coupled to the silicon wafer;
a first insulation block having first and second portions, wherein:
the first portion has first and second surfaces, the first surface of the first portion is opposite the second portion of the first surface, and the first surface of the first portion is coupled to the silicon wafer; and
the second portion has first and second surfaces, the first surface of the second portion is opposite the second portion of the second surface, the second portion of the second surface is a continuation of the second surface of the first portion, and the first surface of the second portion is coupled to the second surface of the first conductive line;
a second insulation block laterally spaced from the first insulation block and having third, fourth and fifth portions, wherein:
  the third portion has first and second surfaces, the first surface of the third portion is opposite the second surface of the third portion, the first surface of the third portion is coupled to the second surface of the first conductive line;
  the fourth portion has first and second surfaces, the first surface of the fourth portion is opposite the second surface of the fourth portion, the second surface of the fourth portion is a continuation of the second surface of the third portion, the first surface of the fourth portion is coupled to the silicon wafer; and
  the fifth portion has first and second surfaces, the first surface of the fifth portion is opposite the second surface of the fifth portion, the first surface of the fifth portion is coupled to the second surface of the second conductive line, and the second surface of the fifth portion is a continuation of the second surface of the fourth portion;
a third insulation block laterally spaced from the second insulation block and having sixth, seventh and eighth portions, wherein:
  the sixth portion has first and second surfaces, the first surface of the sixth portion is opposite the second surface of the sixth portion, and the first surface of the sixth portion is coupled to the second surface of the second conductive line; and
  the seventh portion has first and second surfaces, the first surface of the seventh portion is opposite the second surface of the seventh portion, the second surface of the seventh portion is a continuation of the second surface of the sixth portion, and the first surface of the seventh portion is coupled to the silicon wafer;
a conductive pillar coupled to the second surface of the first conductive line, the second portion, and the third portion, and extending beyond the first and second insulation blocks; and
a conductive adhesive block coupled to the second surface of the second conductive line, the fifth portion and the sixth portion.

2. The IC of claim 1 additionally comprising:
a lead frame having first and second lead frame terminals, wherein the first lead frame terminal is coupled to the first conductive line using a first conductive adhesive; and
a capacitor having first and second capacitor terminals, the first capacitor terminal connected to the second lead frame terminal using a second conductive adhesive, and the second capacitor terminal connected to the second conductive line through the conductive adhesive block.

3. The IC of claim 1, in which the conductive pillar includes copper.

4. The IC of claim 1, in which the first, second and third insulation blocks include polyimide.

5. The IC of claim 2, in which the IC is packaged in a flip chip package.

6. The IC of claim 2, in which the first lead frame terminal is electrically connected to the silicon wafer through the first conductive line, the conductive pillar and conductive adhesive.

7. The IC of claim 1 additionally comprising:
a lead frame having first, second and third lead frame terminals;
a capacitor having first and second capacitor terminals, the first capacitor terminal connected to the second lead frame terminal using a first conductive adhesive, and the second capacitor terminal connected to the third lead frame terminal using a second conductive adhesive; and
the first lead frame terminal is coupled to the first conductive line using a third conductive adhesive.

8. The IC of claim 7, in which the capacitor is electrically isolated from the silicon wafer.

9. A method of fabricating an integrated circuit (IC) in a package comprising:
forming first and second conductive lines, each having first and second surfaces, wherein the first surfaces of the first and second conductive lines are directly coupled to a silicon wafer, and having a space between the first and second conductive lines;
applying a first insulation block having first and second portions, wherein the first portion has a first surface directly coupled to the silicon wafer, and the second portion has a first surface directly coupled to the second surface of the first conductive line;
applying a second insulation block having third, fourth and fifth portions, wherein the third portion has a first surface directly coupled to the second surface of the first conductive line, the fourth portion is coupled to the silicon wafer, the first conductive line and the second conductive line, and the fifth portion is directly coupled to the second surface of the second conductive line;
applying a third insulation block having sixth, seventh and eighth portions, wherein the sixth portion is directly coupled to the second surface of the second conductive line, and the seventh portion is directly coupled to the silicon wafer;
forming a conductive pillar that is directly coupled to the second surface of the first conductive line, to the second portion, and to the third portion;
applying a first conductive adhesive to the second surface of the second conductive line filling a space between the second insulation block and the third insulation block;
bonding a first capacitor terminal to a first lead frame terminal using a second conductive adhesive; and
mating a second lead frame terminal to the conductive pillar using a third conductive adhesive, and mating a second capacitor terminal to the second conductive line using the first conductive adhesive.

10. The method of claim 9, in which the conductive pillar extends beyond the first and second insulation blocks.

11. The method of claim 9, in which the conductive pillar includes copper.

12. The method of claim 9, in which the forming the conductive pillar includes using a photolithographic process.

13. The method of claim 9, including:
prior to the forming the conductive pillar, applying a pillar resist mask to any exposed surfaces of the silicon wafer, the second conductive line and the first and second insulation blocks in areas where the conductive pillar will not be formed; and
removing the pillar resist mask after the conductive pillar is formed.

14. The method of claim 13, in which the pillar resist mask acts as a mold for the conductive pillar.

15. The method of claim 13, in which the second capacitor terminal is bonded to a third lead frame terminal using a fourth conductive adhesive.

16. An integrated circuit (IC) comprising:
- a silicon wafer having first and second surfaces, the second surface opposite the first surface;
- a first conductive line having first and second surfaces, wherein the second surface is opposite the first surface, and the first surface of the first conductive line is coupled to the first surface of the silicon wafer;
- a second conductive line having first and second surfaces, wherein the second surface is opposite the first surface, and the first surface of the second conductive line is coupled to the first surface of the silicon wafer;
- a first insulation block having first and second portions, wherein the first portion has a first surface coupled to the first surface of the silicon wafer, and the second portion has a first surface coupled to the second surface of the first conductive line;
- a second insulation block laterally spaced from the first insulation block and having third, fourth and fifth portions, wherein the third portion has a first surface coupled to the second surface of the first conductive line, the fourth portion has a first surface coupled to the first surface of the silicon wafer and other surfaces coupled to the first and second conductive lines, and the fifth portion has a first surface coupled to the second surface of the second conductive line;
- a third insulation block laterally spaced from the second insulation block and having sixth and seventh portions, wherein the sixth portion has a first surface coupled to the second surface of the second conductive line, and the seventh portion has a first surface coupled to the first surface of the silicon wafer;
- a first conductive pillar on the second surface of the first conductive line, and coupled to the second portion and to the third portion, wherein the first conductive pillar extends beyond the first and second insulation blocks;
- a second conductive pillar on the second surface of the second conductive line, and coupled to the fifth portion and to the sixth portion, wherein, and the second conductive pillar extends beyond the second and third insulation blocks;
- a capacitor having first and second capacitor terminals, wherein the first capacitor terminal is coupled to the second surface of the silicon wafer; and
- a lead frame having first and second lead frame terminals, wherein the first and second respective lead frame terminals are connected to the first and second conductive pillars, respectively, using a conductive adhesive.

17. The IC of claim 16, additionally comprising:
- third and fourth lead frame terminals on the lead frame; and
- a conductive clip having first and second clip end connections, wherein the first and second clip end connections are connected to the third and fourth lead frame terminals, respectively, and the conductive clip is electrically connected to the second capacitor terminal.

18. The IC of claim 17, in which the conductive clip provides an electrical connection between the third and fourth lead frame terminals and the second capacitor terminal.

19. The IC of claim 17, in which the capacitor is electrically connected between the silicon wafer and the third and fourth lead frame terminals.

20. The IC of claim 17, in which the conductive adhesive is a first conductive adhesive, and the capacitor is bonded to the conductive clip using a second conductive adhesive.

* * * * *